(12) United States Patent
Pasotti et al.

(10) Patent No.: US 10,978,146 B2
(45) Date of Patent: Apr. 13, 2021

(54) SINGLE-ENDED PHASE-CHANGE MEMORY DEVICE AND READING METHOD

(71) Applicant: STMicroelectronics S.r.l., Agrate Brianza (IT)

(72) Inventors: Marco Pasotti, Travaco' Siccomario (IT); Riccardo Zurla, Milan (IT); Alessandro Cabrini, Pavia (IT); Guido Torelli, Pavia (IT); Flavio Giovanni Volpe, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 16/662,911

(22) Filed: Oct. 24, 2019

(65) Prior Publication Data

US 2020/0135273 A1 Apr. 30, 2020

(30) Foreign Application Priority Data

Oct. 30, 2018 (IT) .................. 102018000009922

(51) Int. Cl.
*G11C 11/00* (2006.01)
*G11C 13/00* (2006.01)

(52) U.S. Cl.
CPC ........ *G11C 13/004* (2013.01); *G11C 13/0004* (2013.01); *G11C 13/0023* (2013.01); *G11C 13/0038* (2013.01); *G11C 13/0069* (2013.01); *G11C 13/0097* (2013.01); *G11C 2013/0045* (2013.01); *G11C 2013/0054* (2013.01)

(58) Field of Classification Search
CPC .............. G11C 13/004; G11C 13/0069; G11C 13/0004; G11C 11/2273; G11C 11/2275; G11C 13/0007; G11C 11/1673; G11C 11/5678; G11C 2013/0054; G11C 2207/063; G11C 7/06; G11C 11/5685
See application file for complete search history.

(56) References Cited

U.S. PATENT DOCUMENTS

| 2013/0148406 | A1 | 6/2013 | Shimakawa et al. | |
|---|---|---|---|---|
| 2013/0308377 | A1* | 11/2013 | Choi | G11C 13/004 365/163 |
| 2014/0063927 | A1* | 3/2014 | Willey | G11C 13/004 365/163 |

(Continued)

OTHER PUBLICATIONS

IT Search Report and Written Opinion for IT Appl. No. 2018000009922 dated Jun. 26, 2019 (8 pages).

*Primary Examiner* — Uyen Smet

(74) *Attorney, Agent, or Firm* — Crowe & Dunlevy

(57) ABSTRACT

A phase-change memory device, comprising: a memory array of PCM cells, a variable current generator, and a sense amplifier. The current generator comprises a reference array of PCM cells programmed in SET resistance state. The phase-change memory device further comprises a decoder for addressing each cell of the reference array so that a respective plurality of SET current signals is generated through the plurality of reference cells; and a controller configured to receive at input said SET current signals, select a number of SET current signals having the lowest current values among the plurality of SET current signals, calculate a mean value of said lowest current values, and adjust the reference current to be lower than said mean value.

25 Claims, 5 Drawing Sheets

(56) References Cited

U.S. PATENT DOCUMENTS

2014/0204652 A1\* 7/2014 Lee ................. G11C 13/004
                                                                365/148
2015/0092470 A1    4/2015 Vimercati et al.
2019/0392898 A1\* 12/2019 Haukness ............ G11C 7/08

\* cited by examiner

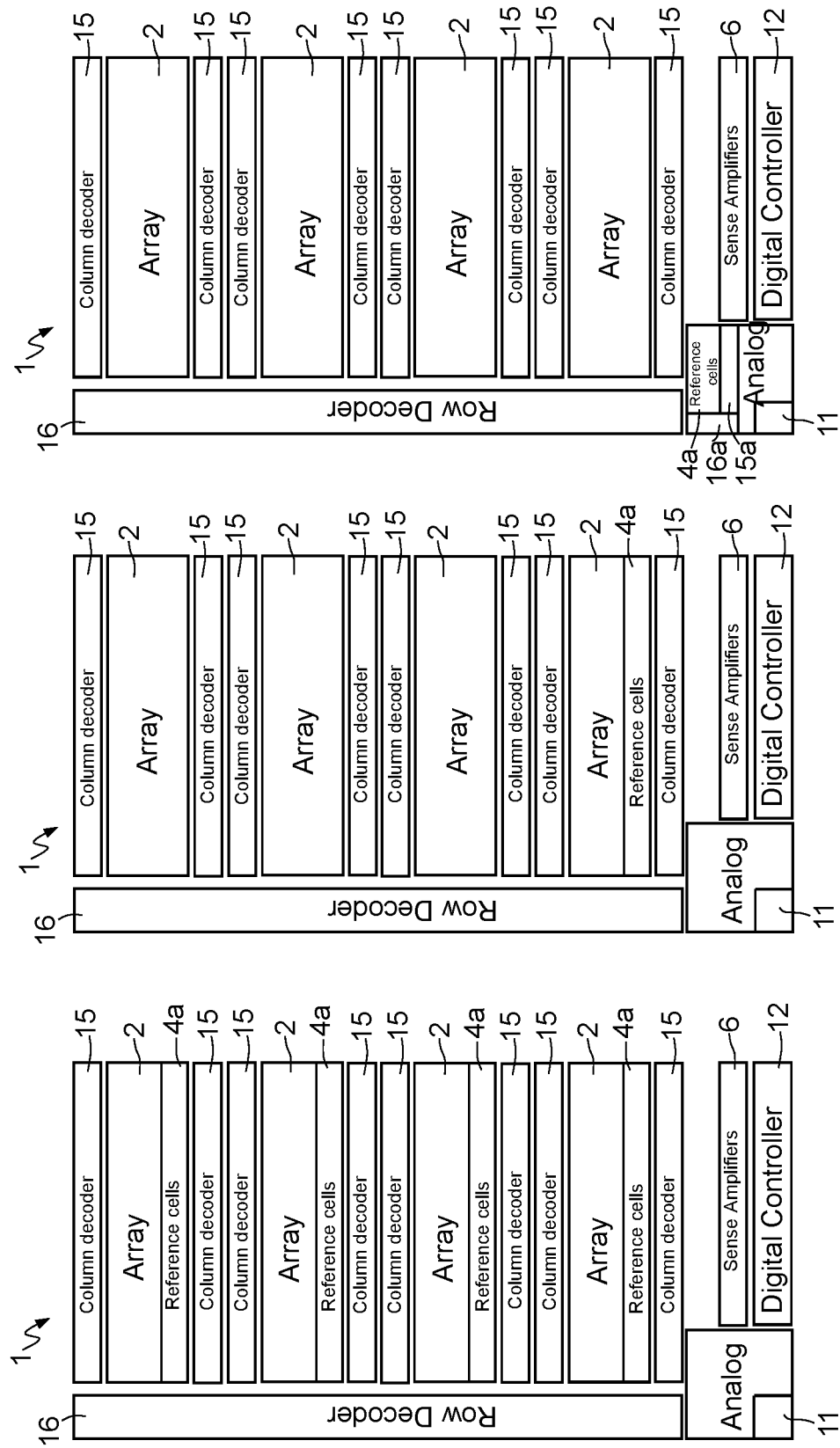

SINGLE-ENDED PHASE-CHANGE MEMORY DEVICE AND READING METHOD

PRIORITY CLAIM

This application claims the priority benefit of Italian Application for Patent No. 102018000009922, filed on Oct. 30, 2018, the content of which is hereby incorporated by reference in its entirety to the maximum extent allowable by law.

TECHNICAL FIELD

The present invention relates to a phase-change memory device and to a method for reading a phase-change memory device.

BACKGROUND

Non-volatile phase-change memories (PCMs) are known, which exploit, for storing information, the characteristics of materials that have the property of switching between solid-state phases that show different electrical characteristics. For instance, said materials may switch between an amorphous phase, which is disordered, to a crystalline or polycrystalline phase, which show higher level of ordering with respect to the amorphous state. The two phases of said materials are associated to resistivities of a considerably different value and consequently to a different value of a logic datum stored in them, therefore making them interesting in memory applications. For instance, Tellurium (Te), Selenium (Se), or Antimony (Sb), called chalcogenide materials, may advantageously be used for producing phase-change memory cells. Moreover, a $Ge_xSb_yTe_z$ alloy (also known as GST) may also be used, with the advantage that the obtained phase-change material is able to guarantee code integrity (i.e. integrity of stored data) after soldering process and data retention in extended temperature range. In particular, extrapolation of data retention at 10 years for temperatures higher than 150° C. cell level has been shown in the known art.

Phase changes are obtained by locally increasing the temperature of the phase-change material through resistive electrodes (generally known as heaters) arranged in contact with respective regions of phase-change material. Selection devices (for example, MOSFETs) are connected to the heaters and enable passage of an electric programming current through a respective heater. Said electric current, by the Joule effect, generates the temperatures necessary to cause the phase change.

To program the cell to its low-resistance state, where the phase-change material is in crystalline state (named "SET" state), an electrical pulse is applied to heat the phase-change material above its crystallization temperature. Alternatively, the material can be first heated to a higher temperature than crystallization temperature and, then, slowly cooled down to normal operating temperature. To set the cell into its high-resistance state, where the phase-change material is in amorphous state (named "RESET" state), an electrical current pulse is applied to heat the phase-change material in order to melt it. By abruptly cutting off the electrical current pulse, the phase-change material quenches into its amorphous phase, thus generating the high-resistance state.

During reading, the state of the chalcogenide material is detected by applying a voltage sufficiently low as not to cause an over-heating of the material and then reading the value of the current that flows in the cell (so called "current-mode reading"). Given that the current is proportional to the conductivity of the chalcogenide material, it is possible to determine the material state and thus trace back the datum stored in the memory cell.

Reading is performed in a differential way (i.e., the so-called "double-ended" mode), as better detailed below, or else with a reference current supplied by a reference-current generator (the so-called "single-ended" mode). To carry out single-ended reading mode, an input of a sense amplifier receives the current of the memory cell that has to be read, whereas the other input of the sense amplifier receives the reference current supplied by the reference-current generator.

It has been noted that GST phase-change cells suffer of resistance drift. This effect causes a variation in resistance during the working life of the cell. Therefore, it is not feasible to select a reference current which is constant during the entire working life of the cell.

A possible solution to this problem relies on the use of a double-ended reading mode to carry out double-ended mode reading, any data ("0" or "1") is stored in a memory cell in its direct form ("0" or "1", respectively) and in an associated memory cell in its complemented form ("1" or "0", respectively). When reading, an input of a sense amplifier receives the current of the "direct" memory cell that has to be read, whereas the other input of the sense amplifier receives the current of the associated "complemented" memory cell.

However, the device area required considerably increases with respect to the single-ended reading mode, since two memory cells are needed to store a single datum, i.e. a single bit of information.

There is a need in the art to provide a phase-change memory device and a method for reading a phase-change memory device that overcome the issues mentioned above.

SUMMARY

A phase-change memory device and a method for reading a phase-change memory device are provided.

In an embodiment, a phase-change memory device comprises: a current generator configured to output a reference current; a memory array including a plurality of memory cells of phase-change material programmable in SET and RESET resistance state and configured to output, during a reading operation of a memory cell of said plurality of memory cells, a reading current which is indicative of a SET or a RESET resistance state of the memory cell being read; and a reading stage, coupled to the current generator and to the memory array.

The reading stage is configured to receive at input the reference current and the reading current, compare the reading current with the reference current, and output a result of such comparison which is indicative of a logic datum stored in the memory cell being read.

The current generator comprises a reference array including a plurality of reference cells of a phase-change material, wherein each reference cell is programmed in SET resistance state.

The phase-change memory device further comprises: a decoder for addressing each reference cell of the reference array so that a respective plurality of SET current signals is generated through the plurality of reference cells; and a controller configured to receive at input said SET current signals, select a number of SET current signals having the lowest current values among the plurality of SET current signals, calculate a mean value of said lowest current values, and adjust the reference current to be lower than said mean value.

In an embodiment, a method is provided for reading a phase-change memory device which comprises a memory array including a plurality of memory cells of phase-change material programmable in SET and RESET resistance state. The method comprises: controlling a current generator to output a reference current; outputting from the memory array, during a reading operation of a memory cell belonging to said plurality of memory cells, a reading current which is indicative of a SET or RESET resistance state of the memory cell being read; supplying, to a reading stage coupled to the current generator and to the memory array, the reference current and the reading current; comparing, by the reading stage, the reading current with the reference current; and outputting, by the reading stage, a result of such comparison which is indicative of a logic datum stored in the memory cell being read.

The current generator comprises a reference array including a plurality of reference cells of a phase-change material, wherein each reference cell is programmed in the SET resistance state.

The method further comprises: programming the reference cells in SET resistance state; addressing each reference cell of the reference array so that a respective plurality of SET current signals is generated through the plurality of reference cell; inputting, to a controller, said SET current signals; selecting, by the controller, a number of SET current signals having the lowest current values among the plurality of SET current signals; calculating, by the controller, a mean value of said lowest current values; and adjusting the reference current to be lower than said mean value.

In an embodiment, a phase-change memory device comprises: a current generator configured to output a reference current; a memory array including a plurality of memory cells of a phase-change material programmable in a SET resistance state and a RESET resistance state and configured to output, during a reading operation of a memory cell of said plurality of memory cells, a reading current which is indicative of the SET or RESET resistance state of the memory cell being read; and a comparison circuit configured to compare the reading current with the reference current to output a result which is indicative of a logic datum stored in the memory cell being read; wherein the reference current output by the current generator is generated in response to a plurality of first current signals generated by reference cells of the phase-change material that are programmed in the SET resistance state.

BRIEF DESCRIPTION OF THE DRAWINGS

For a better understanding of the present invention, preferred embodiments thereof are now described, purely by way of non-limiting example and with reference to the attached drawings, wherein:

FIGS. 8A-8C show alternative embodiments of the memory device of FIG. 1.

DETAILED DESCRIPTION

Figure 1:
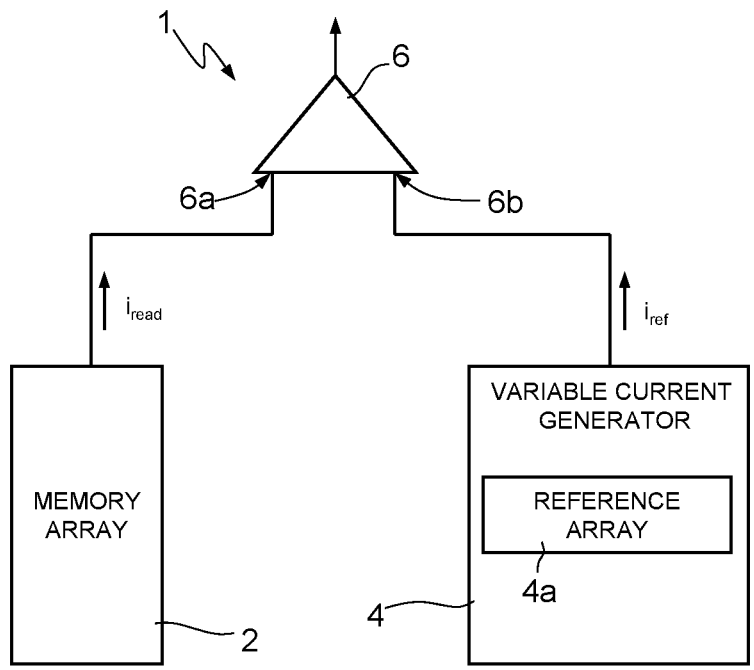
FIG. 1 schematically shows a portion of a memory device which includes a memory array and a reference array of PCM cells, coupled to a sense amplifier for reading selected cells.

FIG. 1 shows a portion of a non-volatile memory device 1, in particular of a phase change memory (PCM) type, limitedly to the elements useful for an understanding of the present disclosure.

In particular, the non-volatile memory device 1 comprises a memory array 2, comprising a plurality of memory cells (here not shown) of a known type, in particular of GST alloy; a variable-current generator 4, including an array 4a of reference cells and configured to generate a reference current $i_{ref}$; and a sense amplifier 6 having a first input port 6a coupled to the memory array 2 to receive a reading current $i_{read}$ associated with a logical bit stored in the cell being read, and a second input port 6b coupled to the variable-current generator 4 to receive the reference current $i_{ref}$.

The sense amplifier 6 is configured to perform a comparison between the reading current $i_{read}$ and the reference current $i_{ref}$.

The array of reference cells 4a includes a plurality (e.g., thirty-three) of PCM cells (in the following, referred to as "reference cells"), each of them being of the same type as the memory cells belonging to the memory array 2. Accordingly, both the memory cells belonging to the memory array 2 and the reference cells undergo a comparable (ideally the same) resistance drift during use, provided that the two sets of cells undergo the same (or similar) writing operations. In this way, the current through the reference cells can be used to effectively track the resistance drift of the memory cells. This aspect will be better discussed later on.

The memory cells are programmed (to the SET or RESET state) using known techniques that are not discussed here and are not part of the present invention.

It is noted that the resistance of the cells in both the RESET and SET states tends to increase over time. Since, when adopting the current-mode reading, this effect is more pronounced for the cells in the SET state, according to an embodiment herein, the reference cells are programmed in the SET state.

Figure 2:
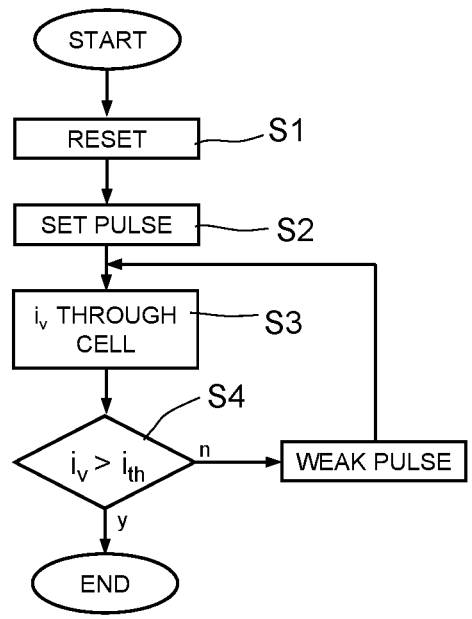
FIG. 2 shows, through a flowchart, a procedure for programming the PCM cells of the reference array of the memory device of FIG. 1 in the SET state.

Each reference cell of array 4a is programmed in the SET state according to the workflow shown in FIG. 2. In particular, in step S1 the reference cell to be programmed is initialized to the RESET state using conventional techniques. A SET current pulse, for example of about 300 µA, is used to heat the reference cell above its crystallization temperature. In order to verify that the SET current pulse positively induced a change of the phase of the reference cell, a current is generated, step S3, through the reference cell by applying a constant voltage across it, for example in the range 0.4-0.8 V; then, step S4, current is compared with a threshold current value $i_{th}$. The threshold current value $i_{th}$ represents the current value that is used as fixed threshold to determine if the reference cell is in a high logic value (SET state) or in a low logic value (RESET state), during the cells programming steps represented in FIG. 2. The threshold current value $i_{th}$ is usually in the range of few tens of µA, for example 30 µA. If the current through the reference cell is found to be lower than the threshold current value $i_{th}$ (exit "n" from step S4 in FIG. 2), a weak pulse, lower than the previous SET current pulse and for example of about 200 µA, is applied to the reference cell in order to further heat it. Then step S3 is repeated. If the current $i_v$ through the reference cell is found to be higher than the threshold current value $i_{th}$ (exit "y" from step S4), the reference cell has been successfully programmed in the SET state, and the programming process is terminated for that reference cell.

Figure 3:
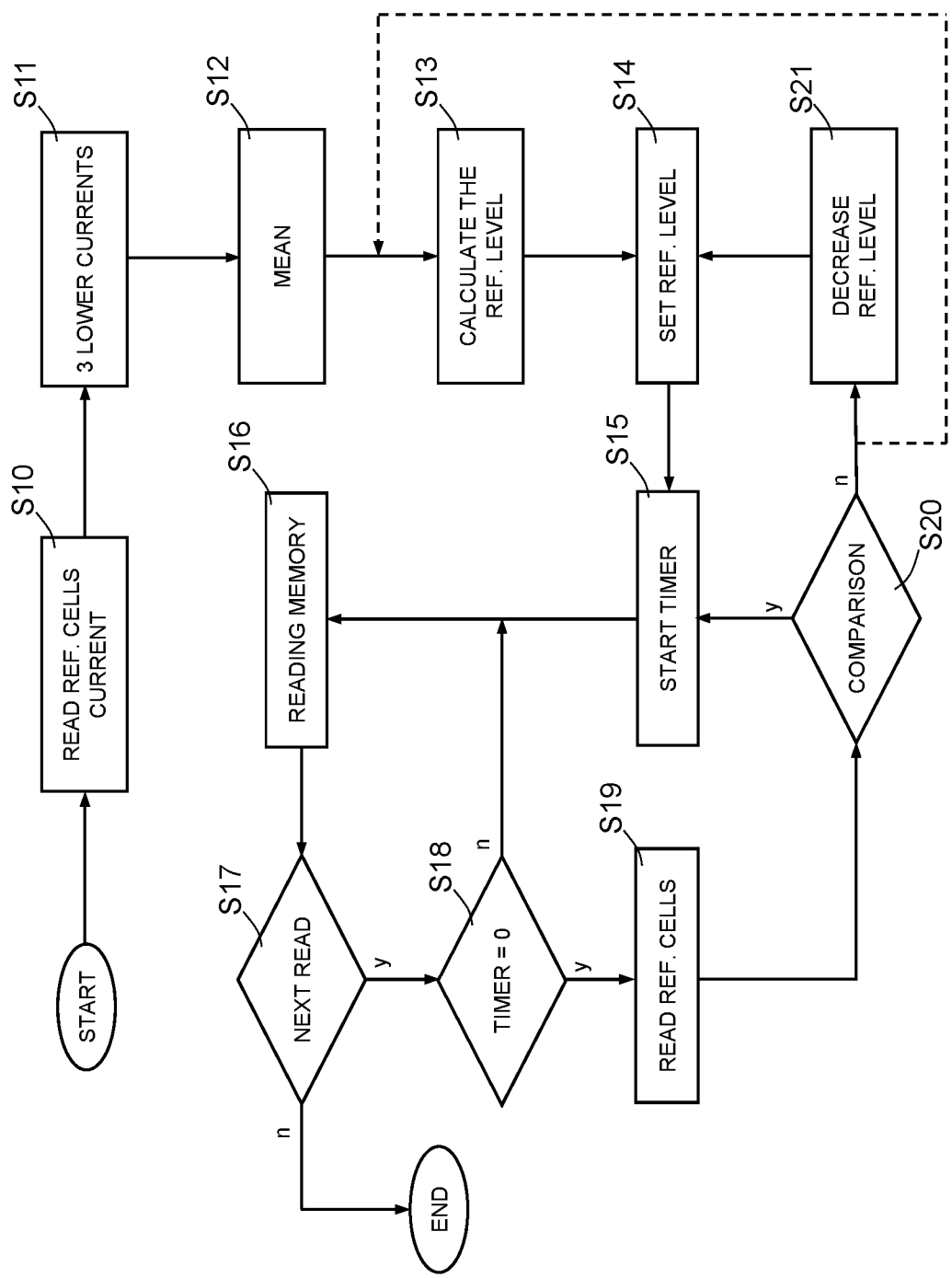
FIG. 3 shows, through a flowchart, a reading method of the memory device of FIG. 1.

After programming all the reference cells belonging to the array of reference cells 4a, information stored in the memory cells can be read by use of the reading process shown in FIG. 3.

With reference to FIG. 3, in step S10 the reference cells are read one by one by applying a constant voltage across them, for example in the range 0.4-0.8 V, thus generating a current that is indicative of the resistance value of the cell being read, and therefore of the phase of the phase-change material.

As is well known, the programming process of any PCM cell (thus also of the reference cells) is such that the resistance value of the cells, immediately after programming, may not be the same; in other words, the resistance value may be slightly different from one cell to another. Accordingly, the currents generated in step S10 may differ from each other. In fact, there are two main causes of variability in the current generated by the cells in step S10; one cause is the spread in programming results, the other cause is the resistance drift. The latter effect is ascribed to a structural rearrangement of the crystallized material immediately after step S10, which eventually may lead to an increase in the resistance of the phase-change material. In particular, some of the programmed reference cells may show current values generated in step S10 which are lower than the threshold current value $i_{th}$ described with reference to FIG. 2.

In step S11, the respective currents of one or more (for example 3) reference cells showing the lowest current value among the array 4a of reference cells (typically, those reference cells subjected to higher resistance drift) are acquired. It is reminded that the current drift of the reference cells is correlated with the resistance drift of the memory cells (this assumption is particularly true when all cells are fabricated in the same die with the same manufacturing process). Accordingly, an indication of the resistance drift of the memory cells can be obtained from an analysis of the resistance drift of the reference cells.

A mean value of the lowest current values acquired in step S11 is calculated, step S12. A controller 12, schematically illustrated in FIGS. 8A-8C, carries out each step involving calculations. Then, step S13, the mean value is used to obtain a reference current value, e.g. according to an embodiment described later on with reference to FIG. 7.

Then, step S14, the reference current value of step S13 is used to generate the reference current $i_{ref}$ of FIG. 1, outputted by the variable current generator of FIG. 1.

In order to take into account that the resistance drift is an ongoing process, the reference current $i_{ref}$ is updated, in particular periodically updated. For example, a timer may be used to set (step S15) a time period $T_{Read}$ (e.g., some hundreds of milliseconds, such as 100-300 ms) during which the reference current $i_{ref}$ is maintained unaltered. After the time period $T_{Read}$, an update of the reference current $i_{ref}$ may be carried out.

Then, step S16, the memory array 2 can be read in a per se known way by comparing the reading current $i_{read}$ with the reference current $i_{ref}$ through the sense amplifier 6 of FIG. 1. The reading process can proceed until all concerned memory cells have been read (step S17) and/or for the entire time period $T_{Read}$ (step S18). If no cell has to be read, the process detailed in FIG. 3 remains in a "stand-by" mode until a new read is requested; when a new read is requested, block S17 is activated again.

When the time period $T_{read}$ elapses, exit "y" from step S18, then step S19 is carried out, including repeating the operations of steps S10-S12; therefore, during step S19, a new mean value is obtained.

The new mean value is compared, step S20, with the last calculated mean value.

If the new mean value is comparable with the last mean value (e.g., they have the same value, or values which differ for a quantity below a predefined threshold, e.g. less than 1-10%), the timer is again set to the time period $T_{Read}$ (exit "y" from step S20), the new mean value is discarded, and the process is repeated from step S15.

Otherwise, exit "n" from step S20, the new mean value is stored and the reference current $i_{ref}$ has to be updated.

In order to update the reference current $i_{ref}$, one can either repeat step S13 (dashed line in FIG. 3) or, step S21, decrease the previous reference current $i_{ref}$ by a predefined fixed quantity (e.g., 1 µA). According to a further embodiment, step S21 may include decreasing the previous reference current $i_{ref}$ by a quantity which is proportional to the difference between the new mean value and the previous (last) mean value.

Then, the process continues from step S14.

The reading process ends when all the memory cells concerned have been read, exit "n" from step S17.

Figure 4:
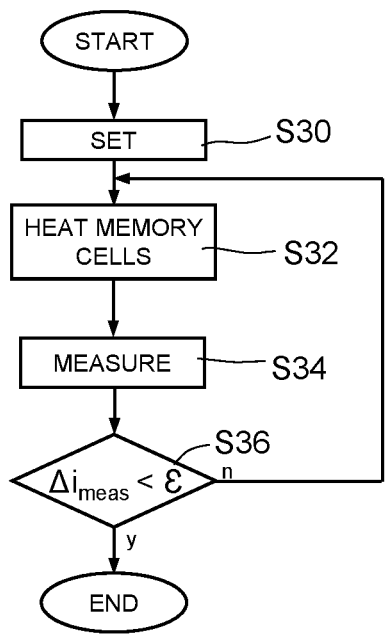
FIG. 4 shows, through a flowchart, a method to characterize the resistance drift of the PCM cells of the memory device of FIG. 1.

An analysis that can be carried out to determine and calculate an adequate value of the reference current in step S13 is represented in FIG. 4, and can be carried out either on the array 2 of memory cells or on a test array structurally analogous to the array 2. In the following description, reference will be made to array 2 without loss of generality. The steps of FIG. 4 are not carried out during use of the memory (read/program steps), but merely refers to possible steps that can be implemented to calculate the reference current to be actually used during the reading of the memory concerned.

The memory cells are initialized to the SET state, state S30, in a per se known way or through a procedure equal to the procedure discussed with reference to FIG. 2 (referring to the reference cells of array 4a).

In step S32, the memory cells are brought to high temperatures, for example to 180° C., for a period of time, for example 1 hour, sufficiently long to induce a resistance change in the phase-change material due to resistance drift. Heating memory cells at high temperature, as long as this temperature is lower than crystallization temperature, accelerates the resistance drift and, therefore, a relative short period of time (typically, of the order of hours) at high temperature, could simulate the resistance drift that takes place in the order of time of years.

Then a constant voltage is applied across the phase-change material of each memory cell, or alternatively across a statistically significant number of memory cells (for example 50% of the memory cells belonging to the array 2), step S34. The currents relative to each cell, generated in step S34, are then collected.

Figure 5A:
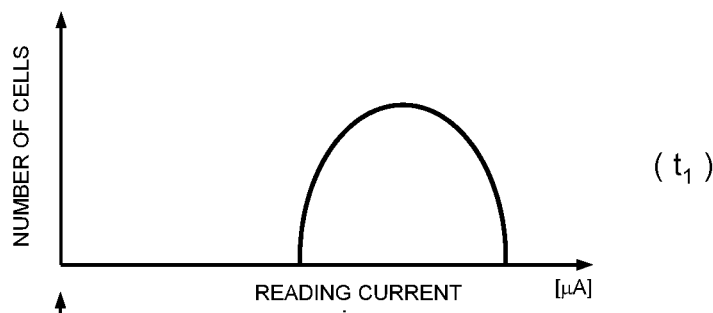
FIGS. 5A-5C show dispersion curves of the memory cells programmed in SET state as a function of the reading current at successive time instants.

FIG. 5A shows a dispersion curve of the memory cells as a function of the reading current $i_{read}$, at a first time instant $t_1$. Different memory cells may exhibit different reading currents, therefore causing the broadening of the curve along the axis of the reading current, as it can be seen in FIG. 5A.

The steps S32-S34 of FIG. 4 are repeated at successive time instants $t_2, \ldots, t_N$.

Figure 5B:
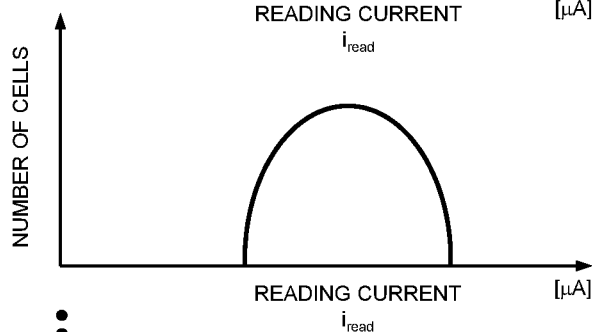
Figure 5C:
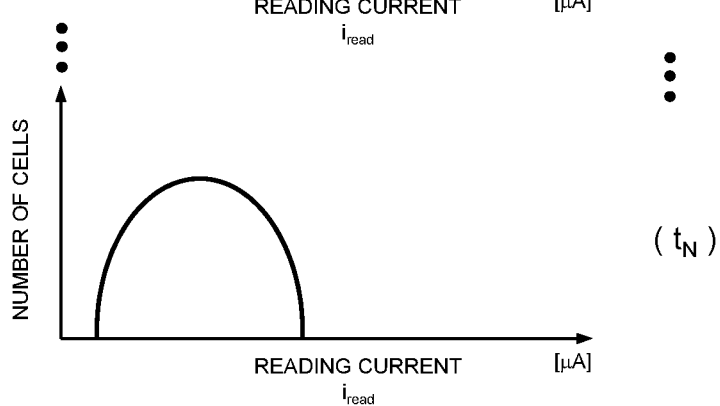

FIG. 5B and FIG. 5C represent the dispersion curve of the memory cells that have the dispersion curve shown in FIG. 5A at different time instants, respectively at $t_2 > t_1$ and $t_N > t_2$, to show the effect of the resistance drift, which shifts the distribution toward lower current values as time increases.

The process of FIG. 4 ends when the difference between the lowest measured reading current at the N-th iteration (time $t_N$) and the lowest measured reading current at (N+1)-th iteration (time $t_{N+1}$) is below a predefined threshold ε, exit "y" from step S36 of FIG. 4. Such threshold can be freely chosen by the skilled person, for example equal to a fraction of μA (e.g., 0.1-0.5 μA). The wording "lowest reading current value" can also be interpreted as the mean value of a plurality (e.g., 10% of the total number of the memory cells considered) of the lowest reading currents of the cells in the SET state.

Figure 6A:
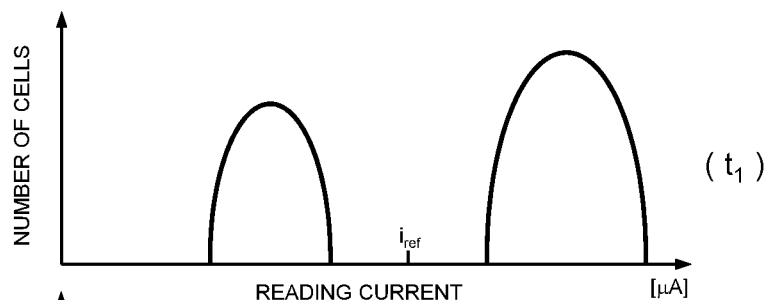
FIGS. 6A-6C show the dispersion curves of the memory cells programmed in both SET and RESET state as a function of the reading current at successive time instants.
Figure 6B:
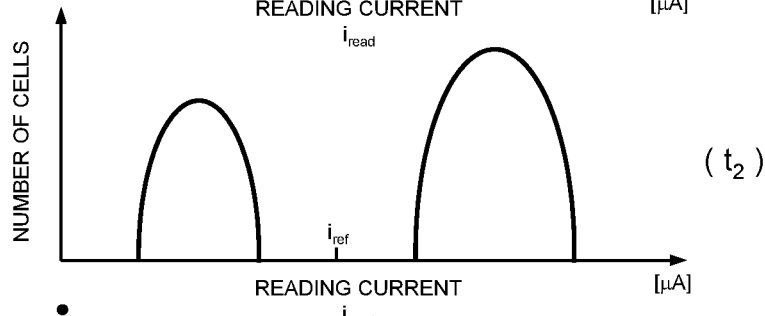
Figure 6C:
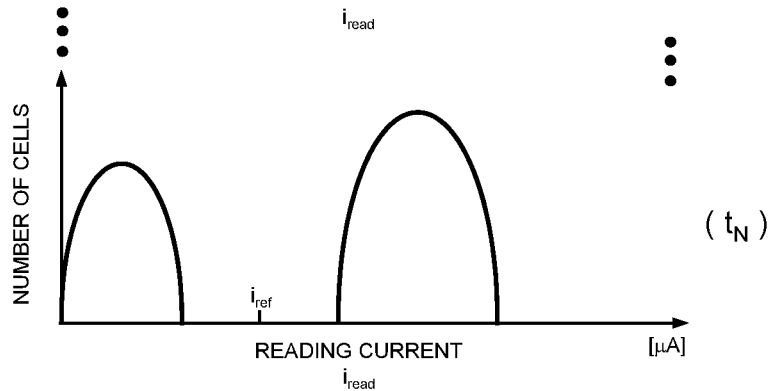

The process performed to generate the dispersion curves of the memory cells programmed in the SET state can be repeated to generate respective dispersion curves of memory cells programmed in the RESET state. In this case, step S30 of FIG. 4 requires programming the memory cells in the RESET state, in a per se known manner. FIGS. 6A-6C show the dispersion curves of both SET and RESET states during "N" time intervals $t_1$-$t_N$. As it can be appreciated, the cells in the RESET state show lower reading current values than the cells in the SET state and a resistance drift analogous (but, generally of a different amount) to that of the cells in the SET state.

The value of the reference current $i_{ref}$ is set between the lowest reading current value of the cells in the SET state and the highest reading current value of the cells in the RESET state (e.g., as the mean value between the lowest reading current value of the cells in the SET state and the highest reading current value of the cells in the RESET state). The wordings "lowest reading current value" and "highest reading current value" can also be interpreted as the mean values of a plurality (e.g., 10% of the total number of the memory cells considered) of the lowest reading currents of the cells in the SET state and, respectively, of the highest reading currents of the cells in the RESET state.

According to the above, it is apparent that the reference current $i_{ref}$ shifts (to lower values) as time increases. More in particular, the reference current $i_{ref}$ decreases as a function of the resistance drift of the phase-change material of the memory cells, which is advantageous for the purpose of reading memory cells.

One embodiment of the present invention foresees implementing step S13 of FIG. 3 through a lookup table, for example stored in a storage device, e.g. in a memory (namely a ROM), identified with reference numeral 11 in FIGS. 8A-8C. The lookup table receives in input the mean value obtained from step S12 and outputs an actual value of reference current $i_{ref}$, which is the output from step S13. Since the mean value of current obtained from step S12 varies with the resistance drift of the memory cells, a correspondent value of reference current $i_{ref}$ can be effectively mapped with a predefined lookup table. More in particular, according to an embodiment, respective values of reference current $i_{ref}$ are associated to respective ranges of mean values of current.

Figure 7:
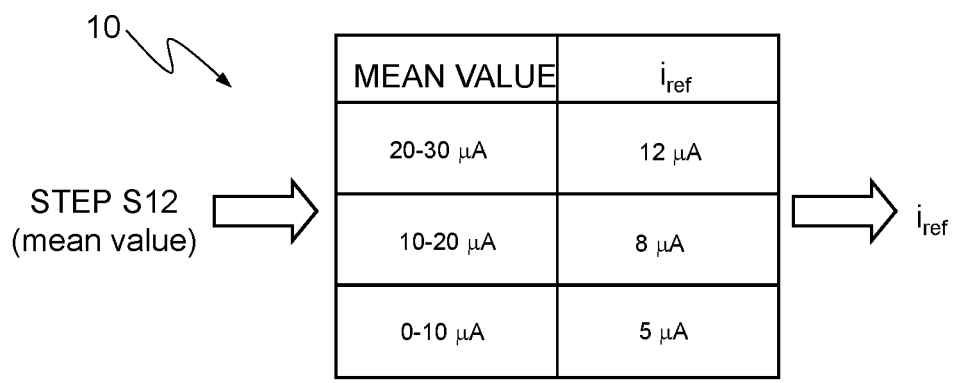
FIG. 7 shows a lookup table used in the method of FIG. 3.

FIG. 7 graphically shows, with the only aim of improving the understanding of the present disclosure, an exemplary lookup table 10, which is not limitative of the present invention. A value of reference current $i_{ref}$ equal to 5 μA corresponds, in this specific embodiment, to mean values of current between 0 and 10 μA; a value of reference current $i_{ref}$ of 8 μA corresponds to mean values of current between 10 and 20 μA; and a reference current $i_{ref}$ value of 12 μA corresponds to mean values of current between 20 and 30 μA.

The actual value of the reference current $i_{ref}$ outputted by the lookup table 10 can be tailored during the design phase, by having knowledge of both dispersion curves of the SET and RESET states in each time interval $t_1$-$t_N$, as shown in FIGS. 6A-6C. As already discussed above, the reference current $i_{ref}$, for each time interval $t_1$-$t_N$, is set between the lowest reading current value of the cells in the SET state and the highest reading current value of the cells in the RESET state.

An alternative embodiment foresees the calculation of the reference current $i_{ref}$ without the need for a lookup table, namely by having knowledge of both dispersion curves of the SET and RESET states during use of the non-volatile memory device 1 and according to steps S10-S13 of FIG. 3. To this end, some of the reference cells are programmed in the SET state, while the remaining reference cells are programmed in the RESET state.

The respective currents of one or more (for example 3) reference cells showing the lowest current values among the array 4a of reference cells (i.e., those reference cells subjected to higher resistance drift), programmed in the SET state, are acquired. A mean value $i_{m\_SET}$ of the lowest current values thus acquired is calculated.

The respective currents of one or more (for example 3) reference cells showing the highest current values among the array 4a of reference cells, programmed in the RESET state, are also acquired. A mean value $i_{m\_RESET}$ of the highest current values thus acquired is calculated.

The reference current $i_{ref}$ is set between the mean value $i_{m\_SET}$ and the mean value $i_{m\_RESET}$, for example as $(i_{m\_SET} + i_{m\_RESET})/2$.

It is also possible, as a further embodiment, to take into account the dependencies upon temperature to which the memory cells are subject during use, and/or leakage current. Temperature and leakage contributions are acquired in a per se known way. Then, the generation of the reference current $i_{ref}$ in step S14 of FIG. 3 can take into account the temperature and/or leakage contributions by adding the temperature and/or leakage contributions to the reference current value of step S13.

As shown in FIG. 8A, the non-volatile memory device 1 can be organized as a plurality of arrays 2 of memory cells and a respective plurality of arrays 4a of reference cells. Each array 2 of memory cells and the respective arrays 4a of reference cells are accessed by a same column decoder 15. A row decoder 16 is shared by all the arrays 2, 4a.

As shown in the alternative embodiment of FIG. 8B, the array of reference cells 4a is shared between the whole plurality of arrays 2. In an embodiment, the array 4a shares the row decoder 16 with the plurality of arrays 2 and the column decoder 15 with one array 4a. Other embodiments are possible.

However, according to the embodiments of FIGS. 8A and 8B, if one among the arrays 2 and the arrays 4a is being accessed, no other arrays 2 or 4a can be read/written (e.g., since array(s) 4a may share one or more decoders with array(s) 2).

An alternative embodiment is shown in FIG. 8C, which overcomes the issues of embodiments of FIGS. 8A-8B. FIG. 8C represents a non-volatile memory device 1 organized as a plurality of arrays 2 of memory cells, addressed by a single row decoder 16 and a column decoder 15 for each array. The array 4a of reference cells is external and physically and/or electrically decoupled from the memory itself. The array 4a is accessed through an own row decoder 16a and an own column decoder 15a. Therefore, the arrays 2 can be read/written in parallel with the array 4a.

From what has been described and illustrated previously, the advantages of the implementations described are evident.

In particular, by avoiding the differential reading, the possibility of storing one bit per memory cell leads to advantages in term of optimization of the device area.

Moreover, the implementations allow for tracking the distributions of memory cells in SET and RESET states, which are subject to resistance drift, therefore taking into account effects related to time and temperature that modify the current read across the memory cell during the reading process.

Moreover, performing a digital reading of the memory cells at predefined time intervals results in a reduction of power consumption and in the implementation of a simple system.

According to an embodiment (shown in FIG. 8C), if the array 4a of reference cells is located in an electrically and physically independent sector with respect to the arrays 2 of memory cells, the reading process of the reference cells can be performed in parallel with the reading process of the memory cells. This possibility contributes to further reduce the time consumption.

Finally, it is clear that modifications and variations may be made to what has been described and illustrated herein, without thereby departing from the scope of the present invention, as defined in the annexed claims.

The invention claimed is:

1. A phase-change memory device, comprising:
   a current generator configured to output a reference current;
   a memory array including a plurality of memory cells of a phase-change material programmable in a SET resistance state and a RESET resistance state and configured to output, during a reading operation of a memory cell of said plurality of memory cells, a reading current which is indicative of the SET or RESET resistance state of the memory cell being read; and
   a reading stage, coupled to the current generator and to the memory array, configured to receive the reference current and the reading current and compare the reading current with the reference current to output a result which is indicative of a logic datum stored in the memory cell being read;
   wherein the current generator comprises a reference array including a plurality of reference cells of the phase-change material that are programmed in the SET resistance state;
   a decoder configured to address the reference cells of the reference array so that a respective plurality of SET current signals is generated; and
   a controller configured to receive said plurality of SET current signals, select a number of the SET current signals having lowest current values, calculate a mean value of said lowest current values, and adjust the reference current to be lower than said mean value.

2. The phase-change memory device according to claim 1, wherein the controller adjusts the reference current by using said mean value to access a lookup table to retrieve a corresponding value of the reference current.

3. The phase-change memory device according to claim 2, wherein the lookup table is pre-calculated and stored in a storage device coupled to said controller.

4. The phase-change memory device according to claim 1, wherein the controller is further configured to maintain the adjusted reference current unaltered for a time interval.

5. The phase-change memory device according to claim 4, wherein the controller is further configured to decrease the adjusted reference current when the time interval expires.

6. The phase-change memory device according to claim 4, wherein the controller is further configured to, when the time interval expires, carry out operations to receive a plurality of updated SET current signals, select a number of the updated SET current signals having lowest current values, calculate an updated mean value of said lowest current values of the updated SET current signals, and, if a difference between the updated mean value and said mean value is greater than a threshold, adjust the reference current to be lower than said updated mean value.

7. The phase-change memory device according to claim 4, wherein the controller is further configured to decrease the adjusted reference current when the time interval expires.

8. The phase-change memory device according to claim 1,
   wherein the reference array further includes a plurality of further reference cells of a phase-change material,
   wherein each further reference cell is programmed in the RESET resistance state,
   wherein the decoder is further configured to address the further reference cells so that a respective plurality of RESET current signals is generated,
   wherein the controller is further configured to receive the RESET current signals, select a number of RESET current signals having highest current values, and calculate a mean value of said highest current values, and
   wherein the controller adjusts the reference current by setting the reference current between the mean value of said highest current values and the mean value of said lowest current values.

9. A method, comprising:
   outputting, during reading of a memory cell of a phase-change memory array including a plurality of memory cells of phase-change material programmable in a SET resistance state and a RESET resistance state, a reading current which is indicative of the SET or RESET resistance state of the memory cell being read;
   generating a reference current using a current generator;
   comparing the reading current with the reference current; and
   outputting a result of such comparison which is indicative of a logic datum stored in the memory cell being read;
   wherein generating the reference current comprises:
      programming a plurality of reference cells of the phase-change material in the SET resistance state;
      addressing the reference cells so that a respective plurality of SET current signals is generated;
      selecting a number of the SET current signals having lowest current values;
      calculating a mean value of said lowest current values; and
      adjusting the reference current to be lower than said mean value.

10. The method according to claim 9, wherein adjusting the reference current includes using said mean value to access a lookup table to retrieve a corresponding value of reference current.

11. The method according to claim 10, further comprising pre-calculating and storing the lookup table in a storage device.

12. The method according to claim 9, further comprising maintaining the adjusted reference current unaltered for a time interval.

13. The method according to claim 12, further comprising decreasing the adjusted reference current when the pre-defined time interval expires.

14. The method according to claim 13, further comprising, when the predefined time interval expires:
acquiring a plurality of updated SET current signals;
selecting a number of updated SET current signals having lowest current values;
calculating an updated mean value of said lowest current values of the updated SET current signals;
determining if a difference between the updated mean value and said mean value is greater than a threshold; and
if so, adjusting the reference current to be lower than said updated mean value.

15. The method according to claim 9, further comprising:
programming a plurality of further reference cells of the phase-change material in a RESET resistance state;
addressing the further reference cells so that a respective plurality of RESET current signals is generated;
selecting a number of the RESET current signals having highest current values;
calculating a mean value of said highest current values; and
adjusting the reference current to be between the mean value of said highest current values and the mean value of said lowest current values.

16. A phase-change memory device, comprising:
a current generator configured to output a reference current;
a memory array including a plurality of memory cells of a phase-change material programmable in a SET resistance state and a RESET resistance state and configured to output, during a reading operation of a memory cell of said plurality of memory cells, a reading current which is indicative of the SET or RESET resistance state of the memory cell being read;
a comparison circuit configured to compare the reading current with the reference current and output a result which is indicative of a logic datum stored in the memory cell being read; and
a controller configured to receive a plurality of first current signals generated by reference cells of the phase-change material that are programmed in the SET resistance state, select a number of the first current signals having lowest current values, calculate a mean value of said lowest current values, and adjust the reference current to be lower than said mean value.

17. The phase-change memory device according to claim 16, wherein the controller adjusts the reference current by using said mean value to access a lookup table to retrieve a corresponding value of the reference current.

18. The phase-change memory device according to claim 17, wherein the lookup table is pre-calculated and stored in a storage device coupled to said controller.

19. The phase-change memory device according to claim 16, wherein the controller is further configured to maintain the adjusted reference current unaltered for a time interval.

20. The phase-change memory device according to claim 19, wherein the controller is further configured to decrease the adjusted reference current when the time interval expires.

21. A phase-change memory device, comprising:
a current generator configured to output a reference current;
a memory array including a plurality of memory cells of a phase-change material programmable in a SET resistance state and a RESET resistance state and configured to output, during a reading operation of a memory cell of said plurality of memory cells, a reading current which is indicative of the SET or RESET resistance state of the memory cell being read;
a comparison circuit configured to compare the reading current with the reference current and output a result which is indicative of a logic datum stored in the memory cell being read; and
a controller configured to receive a plurality of first current signals generated by reference cells of the phase-change material that are programmed in the SET resistance state and a plurality of second current signals generated by reference cells of the phase-change material that are programmed in the RESET resistance state, select a number of the first current signals having lowest current values, calculate a first mean value of said lowest current values, receive said plurality of second current signals, select a number of the second current signals having highest current values, calculate a second mean value of said highest current values, and adjust the reference current to be between the first and second mean values.

22. The phase-change memory device according to claim 21, wherein the controller adjusts the reference current by using said first and second mean values to access a lookup table to retrieve a corresponding value of the reference current.

23. The phase-change memory device according to claim 22, wherein the lookup table is pre-calculated and stored in a storage device coupled to said controller.

24. The phase-change memory device according to claim 21, wherein the controller is further configured to maintain the adjusted reference current unaltered for a time interval.

25. The phase-change memory device according to claim 21, wherein the controller is further configured to, when the time interval expires, carry out operations to receive a plurality of updated SET current signals, select a number of the updated SET current signals having lowest current values, calculate an updated mean value of said lowest current values of the updated SET current signals, and, if a difference between the updated mean value and said mean value is greater than a threshold, adjust the reference current to be lower than said updated mean value.

* * * * *